（12）United States Patent
Kwak

(10) Patent No.: US 7,660,164 B2
(45) Date of Patent: Feb. 9, 2010

(54) METHOD FOR ESTIMATING THRESHOLD VOLTAGE OF SEMICONDUCTOR DEVICE

(75) Inventor: Sang Hun Kwak, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 377 days.

(21) Appl. No.: 11/644,649

(22) Filed: Dec. 22, 2006

(65) Prior Publication Data

US 2007/0153586 A1 Jul. 5, 2007

(30) Foreign Application Priority Data

Dec. 29, 2005 (KR) .................. 10-2005-0133891

(51) Int. Cl.
*G11C 11/34* (2006.01)
(52) U.S. Cl. .................. 365/185.24; 365/185.3; 365/185.18; 365/185.28; 365/185.29
(58) Field of Classification Search ............ 365/185.24, 365/185.29, 185.18, 185.19, 185.28
See application file for complete search history.

(56) References Cited

U.S. PATENT DOCUMENTS 6,687,648 B1 * 2/2004 Kumar et al. ............... 702/181
7,038,482 B1 * 5/2006 Bi .............................. 324/769

FOREIGN PATENT DOCUMENTS

| KR | 2004070671 A | * | 8/2004 |
| KR | 2004070677 A | * | 8/2004 |
| KR | 2004070678 A | * | 8/2004 |

OTHER PUBLICATIONS

H. Bachhofer et al., Transient conduction in multidielectric silicon-oxidenitride-oxide semiconductor structures, Mar. 1, 2001, Journal of Applied Physics, vol. 89, No. 5, 2791-2800.*

* cited by examiner

*Primary Examiner*—VanThu Nguyen
*Assistant Examiner*—R Lance Reidlinger
(74) *Attorney, Agent, or Firm*—The Law Offices of Andrew D. Fortney; Andrew D. Fortney

(57) ABSTRACT

A method is provided, which can improve the efficiency of device design by estimating the variation of threshold voltage according to the pulse widths of applied voltage for a semiconductor device in mass product.

19 Claims, 2 Drawing Sheets

METHOD FOR ESTIMATING THRESHOLD VOLTAGE OF SEMICONDUCTOR DEVICE

BACKGROUND OF THE INVENTION

1. Field of the Invention

The present invention relates to a method for estimating threshold voltage according to a pulse width of voltage applied to a semiconductor device (such as a nonvolatile memory transistor or cell).

2. Description of the Related Art

Generally, an Electrically Erasable Programmable Read-Only Memory (EEPROM) is representative of nonvolatile memory devices, in which data is not erased even when power is not supplied.

An EEPROM is a nonvolatile memory device in which rewriting is electrically possible, and a structure employing a floating gate cell has been widely used. Recently, with the rapid high integration of memory devices, it is very desirable to reduce the conventional floating gate cell, but high voltage is required when programming/erasing is performed and it is difficult to ensure a process margin such as tunnel definition. Therefore, it is very challenging to further reduce the size or area of a floating gate cell. On account of this, research into SONOS, FeRAM, SET, NROM, etc., has been actively conducted, which are nonvolatile memory devices that can be substituted for the floating gate cell. Of them, the SONOS (e.g., silicon-oxide-nitride-oxide-semiconductor) cell has attracted public attention as a next generation cell that can be substituted for a stacked floating gate cell.

However, since there is no special threshold voltage modeling method for a SONOS flash cell, it is impossible to estimate the variation of threshold voltage of a SONOS transistor according to the pulse width of applied voltage for all manufactured products. Therefore, it is difficult to consider the variation in device design.

SUMMARY OF THE INVENTION

Accordingly, the present invention is directed to a method for estimating threshold voltage of a semiconductor device that substantially obviates one or more problems due to limitations and disadvantages of the related art.

An object of the present invention is to provide a method for estimating threshold voltage of a semiconductor device, which can estimate the variation of threshold voltage according to the pulse width of an applied voltage for the semiconductor device in mass production.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

In accordance with one embodiment of the present invention, there is provided a method for estimating a threshold voltage of a semiconductor device, the method including a step of computing a threshold voltage according to inputted pulse width values through an equation (1):

$$V_{th}(P_w) = \frac{V_{th0} - V_{dg}}{1 + \left(\frac{P_w}{X_o}\right)^p} + V_{dg} \qquad (1)$$

Preferably, the method includes a step of computing the threshold voltage in a programmed state and an erased state of the semiconductor device using the equation.

Preferably, in the programmed state, $V_{th0}$ has a value of from 5 to 6 (e.g., 5.42982), $V_{dg}$ has a value of from −0.9 to −1 (e.g., −0.9346), $X_o$ has a value of from 0.002 to 0.003 (e.g., 0.00259), and p has a value of from 0.5 to 0.6 (e.g., 0.54508).

Preferably, in the erased state, $V_{th0}$ has a value of from −0.09 to −0.1 (e.g., −0.09563), $V_{dg}$ has a value of from 4 to 6 (e.g., 4.87895), $X_o$ has a value of from 0.0002 to 0.0004 (e.g., 0.00031), and p has a value of from 0.2 to 0.4 (e.g., 0.3109). In either the programmed or erased state case, the exemplary values for the parameters $V_{th0}$, $V_{dg}$, $X_o$ and p may have a number of significant digits less than the number given, and the least significant digit in any such case may be rounded or may vary within ±1 or 2. In addition, the parameters $V_{th0}$ may refer to an ideal threshold voltage of the transistor in either the programmed or erased state (e.g., when the programming or erasing pulse width has a zero value or an infinite value, respectively), $V_{dg}$ may refer to an ideal drain-to-gate voltage drop in of the transistor in the programmed or erased state, $X_o$ may refer to an empirically determined pulse width, and p may refer to an empirically determined non-linear fitting or optimization factor. Also, the parameter $P_w$ generally refers to the applied pulse width.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, preferred embodiment of the present invention will be described in detail with reference to the accompanying drawings. It is noted that the embodiment is proposed as an example without limiting the scope of the claims of the present invention.

Figure 1:
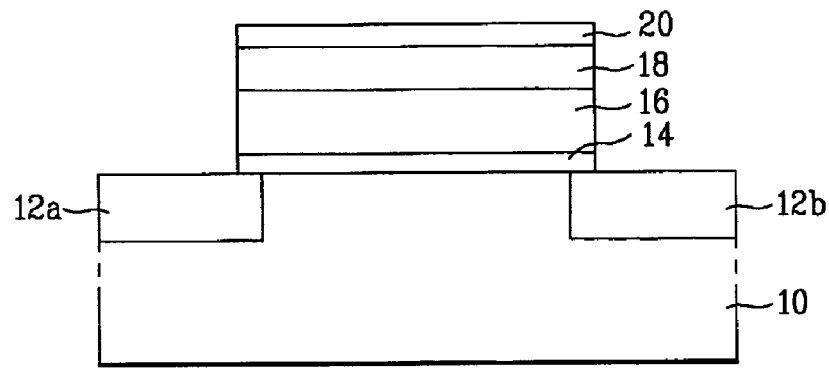
FIG. 1 is a sectional view of the unit cell of a flash memory device with a SONOS structure according to the present invention.

FIG. 1 is a sectional view of the unit cell of a flash memory device with a SONOS structure according to the present invention.

As illustrated in FIG. 1, the flash memory device with the SONOS structure according to the present invention includes an ONO layer 14/16/18, a control gate 20 formed on the ONO layer, and source/drain regions 12a and 12b. The ONO layer is formed by sequentially laminating a first oxide layer 14, a nitride layer 16 and a second oxide layer 18 on (e.g., a p-type) semiconductor substrate 10. Thus, the ONO layer generally comprises a first (tunnel) oxide layer 14, a nitride (trap) layer 16 and a second (blocking) oxide layer 18. The source/drain regions 12a and 12b are formed by implanting high concentration n-type impurities into the substrate 10 on opposed sides of the control gate 20.

The first oxide layer 14 is generally a tunneling oxide layer. The nitride layer 16 may be characterized as a memory layer, which has a memory function by controlling the threshold voltage $V_{th}$ of a cell through a process of trapping electric charges in a trap site (or emitting an electric field from such stored electric charges). The second oxide layer 18 is a blocking oxide layer for preventing the loss of the charged electric charges.

The flash memory device with the SONOS structure according to the present invention as described above may use channel hot electron injection when programming the device, and may use hot hole injection when erasing (or removing injected electrons) the device. Alternatively, the electrons and/or holes may be injected by Fowler-Nordheim tunneling.

That is, when programming is performed, a predetermined positive voltage is applied to the drain region 12b and the control gate 20, and the source region 12a and semiconductor substrate 10 are grounded.

If a bias is applied under the above conditions, electrons in the transistor channel are accelerated by lateral electric field generated by the biases toward the drain region 12b from the source region 12a, so that hot electrons are generated around the drain region 12b. Such hot electrons jump over the electric potential barrier of the first oxide layer 14, and then are locally trapped in the trap level of the nitride layer 16 around the drain region 12b, so that the threshold voltage of the device increases. This is referred to as Channel Hot Electron Injection (CHEI).

Hereinafter, the erase operation of the SONOS flash memory device according to the present invention will be described.

In the erase operation, a predetermined positive voltage is applied to the drain region 12b, a predetermined negative voltage is applied to the control gate 20, and the source region 12a and semiconductor substrate 10 are grounded.

If a bias is applied under the above conditions, a depletion region is formed in the drain region 12b (generally a high concentration n-type impurity region) by the high electric field formed in the region in which the drain region 12b overlaps with the control gate 20. Further, electron/hole pairs are generated in depletion region by band-to-band tunneling.

The generated electrons flow into the high concentration n-type impurity region, and the holes are accelerated by the lateral electric field formed in the depletion region and then are converted into hot holes. Such hot holes are injected into the nitride layer 16 (or the valence band thereof) and then are trapped (e.g., after jumping over the energy barrier between the first oxide layer 14 and the semiconductor substrate 10), so the erase operation is performed, in which the threshold voltage decreases. This is referred to as Hot Hole Injection (HHI).

As described above, the threshold voltage changes depending on the presence or absence of electrons in the nitride layer 16. Accordingly, each threshold voltage is measured when the device is programmed and when the device is erased. The threshold voltages of programmed and erased SONOS devices are then modeled, so that the state of the nitride layer 16 may be estimated.

In the present invention, in order to model the threshold voltage according to a pulse width of an applied voltage, the voltages when the devices are programmed and when the devices are erased are respectively determined for several or several tens of SONOS cell transistor samples, the threshold voltages are measured according to the pulse width as the pulse width is increased, and each state of the device(s) are plotted to extract a corresponding graph.

Figure 2:
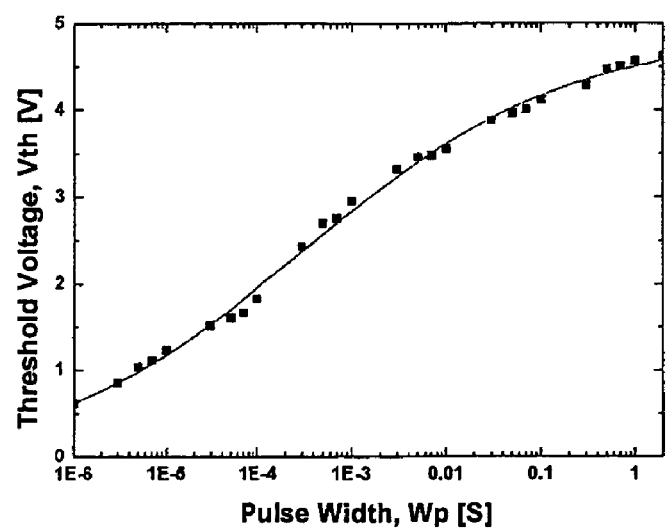
FIG. 2 is a graph illustrating measured values of threshold voltage according to pulse widths in a programming state according to the present invention.
Figure 3:
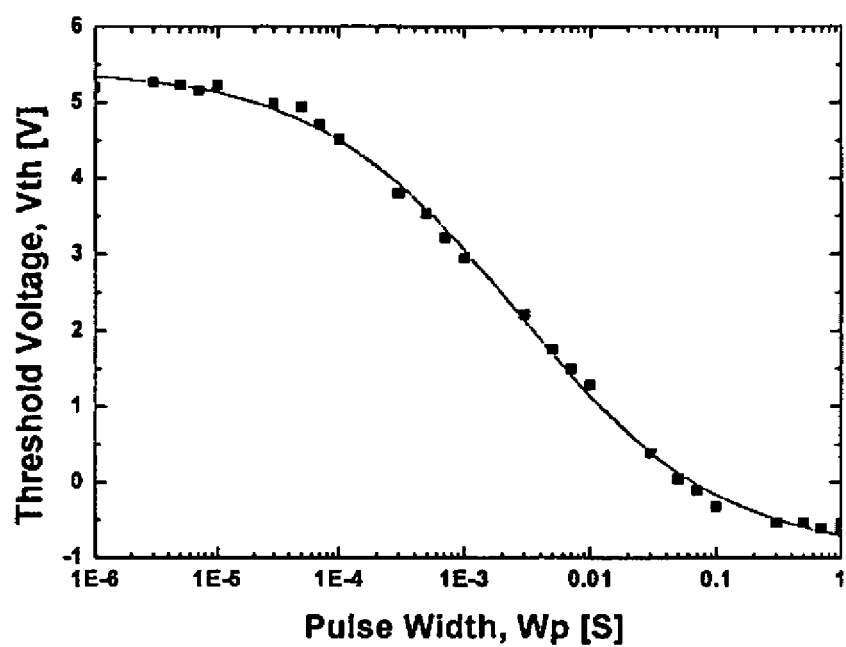
FIG. 3 is a graph illustrating measured values of threshold voltage according to pulse widths in an erase operation state according to the present invention.

FIGS. 2 and 3 are graphs for a 0.25 µm technology SONOS cell according to one embodiment of the present invention.

FIG. 2 is a graph illustrating measured values of the threshold voltage according to pulse widths with a range of 1 usec to 2 sec in a programmed state. The programming voltage for the SONOS cell transistor to shift to the programmed state is 12V.

FIG. 3 is a graph illustrating measured values of the threshold voltage according to pulse widths with a range of 1 usec to 2 sec in an erased state. The erase operation voltage for the SONOS cell transistor to shift to the erased state is −10V.

In one exemplary model of a SONOS cell transistor in mass production, graphs representing measured values of threshold voltage according to (or as a function of) pulse widths in programmed and erased states are illustrated as FIGS. 2 and 3, respectively, and device variables $X_o$, $V_{th0}$, $V_{dg}$ and p of equation 1 are extracted by using non-linear fitting or non-linear optimization on the basis of the graphs.

$$V_{th}(P_w) = \frac{V_{th0} - V_{dg}}{1 + \left(\frac{P_w}{X_o}\right)^p} + V_{dg} \qquad \text{Equation 1}$$

Table 1 below shows device variables extracted by applying the non-linear fitting or non-linear optimization to FIGS. 2 and 3 for an exemplary 0.25 technology SONOS cell according to one embodiment of the present invention.

TABLE 1

| Vtho | Vdg | Xo | P |
|---|---|---|---|
| Programmed state | | | |
| 5.42982 | −0.9346 | 0.00259 | 0.54508 |
| Erased state | | | |
| −0.09563 | 4.87895 | 0.00031 | 0.3109 |

If the variables and pulse widths of Table 1 are put into the variables of Equation 1, it is possible to estimate the threshold voltage according to (or as a function of) the pulse widths of applied voltages for a certain SONOS cell.

According to the present invention, it is possible to estimate the variation of threshold voltage according to the pulse widths of the applied voltages by using equation 1. Consequently, it is possible to improve the efficiency of device design.

What is claimed is:

1. A method for estimating a threshold voltage of a semiconductor nonvolatile memory device, the method including:

measuring threshold voltages of sample semiconductor nonvolatile memory devices over a range of pulse widths, the sample semiconductor nonvolatile memory device comprising first source/drain regions in a first semiconductor substrate and a first charge storage layer sequentially comprising a first oxide layer, a nitride layer and a second oxide layer on the first semiconductor substrate;

computing a threshold voltage of a manufactured semiconductor nonvolatile memory device according to inputted pulse width values through an equation:

$$V_{th}(P_w) = \frac{V_{th0} - V_{dg}}{1 + \left(\frac{P_w}{X_o}\right)^p} + V_{dg} \quad (1)$$

the manufactured semiconductor nonvolatile memory device comprising second source/drain regions in a second semiconductor substrate and a second charge storage layer sequentially comprising a first oxide layer, a nitride layer and a second oxide layer on the second semiconductor substrate; and estimating a state of the nitride layer in the second charge storage layer using the computed threshold voltage;

wherein $V_{th0}$ is an ideal threshold voltage of the manufactured nonvolatile memory device, $V_{dg}$ is an ideal drain-to-gate voltage drop of the manufactured nonvolatile memory device, $X_0$ is a determined pulse width, p is a determined non-linear fitting or optimizing factor, and $P_w$ is the applied pulse width.

2. The method according to claim 1, wherein measuring the threshold voltages of the sample semiconductor nonvolatile memory devices comprises measuring a first set of threshold voltages of the sample semiconductor nonvolatile memory devices over the range of pulse widths when the devices have a programmed state, and measuring a second set of threshold voltages of the sample semiconductor nonvolatile memory devices over the range of pulse widths when the devices have an erased state.

3. The method according to claim 2 comprising computing a first threshold voltage of the manufactured semiconductor nonvolatile memory device in a programmed state and a second threshold voltage of the manufactured semiconductor nonvolatile memory in an erase operation erased state using the equation.

4. The method according to claim 3, wherein, in the programmed state, $V_{th0}$ has a value of from 5 to 6.

5. The method according to claim 3, wherein, in the programmed state, $V_{dg}$ has a value of from −0.9 to −1.

6. The method according to claim 3, wherein, in the programmed state, $X_0$ has a value of from 0.002 to 0.003.

7. The method according to claim 3, wherein, in the programmed state, p has a value of from 0.5 to 0.6.

8. The method according to claim 3, wherein, in the programmed state, $V_{th0}$ has a value of 5.42982, $V_{dg}$ has a value of −0.9346, $X_0$ has a value of 0.00259 and p has a value of 0.54508.

9. The method according to claim 3, wherein, in the erased state, $V_{th0}$ has a value of from −0.09 to −0.1.

10. The method according to claim 3, wherein, in the erased, $V_{dg}$ has a value of from 4 to 6.

11. The method according to claim 3, wherein, in the erased state, $X_o$ has a value of from 0.0002 to 0.0004.

12. The method according to claim 3, wherein, in the erased state, p has a value of from 0.2 to 0.4.

13. The method according to claim 3, wherein, in the erased state, $V_{th0}$ has a value of −0.09563, $V_{dg}$ has a value of 4.87895, $X_0$ has a value of 0.00031 and p has a value of 0.3109.

14. The method according to claim 2, further comprising plotting the first set of threshold voltages as a function of the applied pulse width on a first graph, and plotting the second set of threshold voltages as a function of the applied pulse width on a second graph.

15. The method according to claim 14, further comprising extracting values of $V_{th0}$, $V_{dg}$, $X_o$ and p from the first and second graphs.

16. The method according to claim 15, wherein the values of $V_{th0}$, $V_{dg}$, $X_o$ and p are extracted from the first and second graphs using non-linear fitting or non-linear optimization.

17. The method according to claim 1, wherein the threshold voltages are measured according to the pulse width as the pulse width is increased.

18. The method according to claim 1, wherein each of the sample nonvolatile memory devices and the manufactured nonvolatile memory device further comprise a control gate above the respective charge storage layer.

19. The method according to claim 1, wherein each of the sample nonvolatile memory device and the manufactured nonvolatile memory device comprises a flash memory device.

* * * * *